(12) United States Patent
Adler et al.

(10) Patent No.: US 9,639,423 B2
(45) Date of Patent: May 2, 2017

(54) METHOD AND APPARATUS FOR RECOVERING METADATA LOST DURING AN UNEXPECTED POWER DOWN EVENT

(71) Applicant: Marvell World Trade LTD., St. Michael (BB)

(72) Inventors: Jason Adler, Fremont, CA (US); Perry Neos, San Jose, CA (US); Luan Ton-That, San Jose, CA (US); Gwoyuh Hwu, Cupertino, CA (US)

(73) Assignee: MARVELL WORLD TRADE LTD., St. Michael (BB)

( * ) Notice: Subject to any disclaimer, the term of this patent is extended or adjusted under 35 U.S.C. 154(b) by 86 days.

(21) Appl. No.: 14/538,179

(22) Filed: Nov. 11, 2014

(65) Prior Publication Data
US 2015/0143174 A1 May 21, 2015

Related U.S. Application Data

(63) Continuation of application No. 13/110,517, filed on May 18, 2011, now Pat. No. 8,886,870.
(Continued)

(51) Int. Cl.
*G06F 11/14* (2006.01)
*G11C 14/00* (2006.01)
*G06F 12/02* (2006.01)

(52) U.S. Cl.
CPC ...... *G06F 11/1435* (2013.01); *G06F 11/1451* (2013.01); *G06F 12/0246* (2013.01);
(Continued)

(58) Field of Classification Search
None
See application file for complete search history.

(56) References Cited

U.S. PATENT DOCUMENTS 5,325,531 A * 6/1994 McKeeman ............. G06F 8/20
717/112
5,802,572 A * 9/1998 Patel ................... G06F 12/0815
711/128
(Continued)

FOREIGN PATENT DOCUMENTS

CN 101192195 A 6/2008
CN 101558392 A 10/2009
(Continued)

OTHER PUBLICATIONS

Japanese Office Action for related Japanese Application No. 2013-512090 dated Feb. 24, 2015; 3 pages.
(Continued)

*Primary Examiner* — Jared Rutz
*Assistant Examiner* — Charles Choi (57) ABSTRACT

A system including first and second memory and a control module. The first memory stores a first lookup table with first metadata that includes a first mapping between logical and physical addresses and is lost due to an unexpected power down event. The second memory stores a second lookup table with second metadata and an event log. The second metadata includes a second mapping between the logical and physical addresses. The event log includes entries indicating updated associations between respective ones of the logical addresses and one of the physical addresses as included in the first metadata prior to the power down event. The control module: prior to the power down event, performs segmented flushes each including updating a segment of the second metadata with a corresponding segment of the first metadata; and walks the event log to recover a full flush cycle of segments of the first metadata.

21 Claims, 6 Drawing Sheets

Related U.S. Application Data (60) Provisional application No. 61/347,919, filed on May 25, 2010.

(52) U.S. Cl.
CPC ...... *G11C 14/0018* (2013.01); *G11C 14/0063* (2013.01); *G06F 2201/84* (2013.01)

(56) References Cited

U.S. PATENT DOCUMENTS

| | | | |
|---|---|---|---|
| 6,691,203 B1* | 2/2004 | Chen | G06F 3/061 |
| | | | 360/32 |
| 8,572,309 B2 | 10/2013 | Ton-That et al. | |
| 2003/0163632 A1* | 8/2003 | Aasheim | G06F 3/0619 |
| | | | 711/103 |
| 2006/0253645 A1* | 11/2006 | Lasser | G06F 12/0246 |
| | | | 711/103 |
| 2007/0101096 A1 | 5/2007 | Gorobets | |
| 2007/0168698 A1 | 7/2007 | Coulson et al. | |
| 2008/0126683 A1 | 5/2008 | Tsuji | |
| 2008/0177937 A1 | 7/2008 | Nishihara et al. | |
| 2008/0228992 A1 | 9/2008 | Dumitru | |
| 2009/0327589 A1* | 12/2009 | Moshayedi | G06F 11/1441 |
| | | | 711/103 |
| 2010/0235565 A1* | 9/2010 | Ton-That | G06F 11/1441 |
| | | | 711/103 |

FOREIGN PATENT DOCUMENTS

| | | |
|---|---|---|
| JP | 2008181204 A | 8/2008 |
| JP | 2008544343 A | 12/2008 |
| WO | WO-2006120679 A2 | 11/2006 |

OTHER PUBLICATIONS

Chinese Office Action for related Chinese Application No. 201180031597.0 dated Jan. 9, 2015; 13 pages.

\* cited by examiner

METHOD AND APPARATUS FOR RECOVERING METADATA LOST DURING AN UNEXPECTED POWER DOWN EVENT

CROSS-REFERENCE TO RELATED APPLICATIONS

The present disclosure is a continuation of U.S. patent application Ser. No. 13/110,517 (now U.S. Pat. No. 8,886, 870), filed May 18, 2011. This application claims the benefit of U.S. Provisional Application No. 61/347,919, filed on May 25, 2010. The entire disclosures of the above applications referenced above are incorporated herein by reference.

FIELD

The present disclosure relates to storing and receiving metadata of a solid-state drive.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A data storage system may include various removable and non-removable storage devices. The storage devices may include both volatile memory devices and non-volatile memory devices, such as a hard disk drive (HDD), an optical storage drive, and a removable solid-state drive (SSD) with flash memory.

The flash memory of a storage device may store metadata. The metadata may include logical-to-physical address entries, which are used to convert logical addresses from a host to physical addresses of the flash memory. A control module of the SSD may access locations in the flash memory based on the physical addresses determined according to the metadata.

During operation of the data storage system, the metadata is updated and stored in volatile memory of the SSD when user data is read from and/or written to the flash memory. The metadata is transferred from the volatile memory to the flash memory when the data storage system is powered down. The metadata that is transferred to the flash memory is reloaded into the volatile memory when the data storage system is powered back up. This allows the SSD to maintain an updated mapping between logical addresses and physical addresses of the SSD.

SUMMARY

A system is provided and includes a first memory configured to store a first lookup table (LUT) with first metadata. A second memory is configured to store a second LUT with second metadata, wherein the first metadata includes a first mapping between logical addresses and physical addresses. The second metadata includes a second mapping between the logical addresses and the physical addresses. A control module is configured to update the first metadata. The control module is configured to update segments of the second metadata based on the first metadata at respective predetermined times. Each of the segments refers to a predetermined number of entries of the second LUT.

In other features, the first memory includes volatile memory. The second memory includes non-volatile memory. In other features, the second memory is configured to store third metadata. The third metadata is dependent on at least one of the first metadata or the second metadata. The control module is configured to update the third metadata at each of the respective predetermined times.

In other features, the second memory is configured to store third metadata. The third metadata is dependent on at least one of the first metadata or the second metadata. The control module is configured to update the third metadata at a time that is different than the respective predetermined times.

In other features, the control module is configured to update third metadata at predetermined intervals. The third metadata is dependent on at least one of the first metadata or the second metadata. The third metadata comprises at least one of pointers of user data, pointers of system data, amounts of data stored in blocks of memory, or defect information. In other features, the third metadata is dependent on a time-coherent version of the second LUT.

In other features, the control module is configured to update portions of the first metadata in the first memory while backing up other portions of the first metadata in the second memory. In other features, the control module is configured to write user data to the second memory and update first segments of the first LUT in the first memory while backing up second segments of the first LUT in the second memory.

In other features, during a power ON event, the control module is configured to update segments of the first memory based on entries of an event log and upload segments of the second memory to the first memory. The entries of the event log include metadata changes between selected ones of the physical addresses and the logical addresses conducted prior to a loss in power of a drive of the system.

In other features, the control module is configured to: determine flush times of segments of the first metadata; wait flush periods between flush events; and flush the segments of the first metadata at respective ones of the flush times by copying the first metadata from the first memory to the second memory.

In other features, a system is provided and includes a first memory configured to store a first lookup table (LUT) with first metadata. A second memory is configured to store a second LUT with second metadata. The first metadata includes a first mapping between logical addresses and physical addresses. The second metadata includes a second mapping between the logical addresses and the physical addresses. A control module configured to, during a power ON event, upload segments of the second memory to the first memory and update segments of the first memory based on entries of an event log. The entries of the event log include metadata updates between selected ones of the physical addresses and the logical addresses conducted prior to the power ON event.

In other features, during the power ON event and when LUT dependent metadata is not stored in the second memory, the control module is configured to upload at least a full cycle of the segments from the second memory to the first memory.

In other features, during the power ON event and when LUT dependent metadata is stored in the second memory. The control module is configured to upload at least a full cycle of the segments from the second memory to the first memory prior to uploading the LUT dependent metadata from the second memory to the first memory.

In other features, during the power ON event, the control module is configured to: determine whether a proper power down of the system has occurred. A proper power down occurs when the first LUT was flushed to the second memory prior to a last power down event of the system. When a proper power down of the system has occurred, the control module is configured to transfer the second metadata from the second memory to the first memory and refrain from walking the event log. When a proper power down of the system has not occurred, the control module is configured to transfer the second metadata from the second memory to the first memory and walk of the event log.

In other features, the control module is configured to upload at least a full flush cycle of the segments updated prior to a time when power of a solid-state drive was lost. The at least a full flush cycle of the segments is uploaded from the second memory to the first memory. The first metadata includes the at least a full flush cycle of the segments. The control module is further configured to walk the event log to update the first metadata from a time when a first one of the at least a full flush cycle of the segments was flushed to a time slot of the event log when the power of the solid-state drive was lost. The power ON event is performed subsequent to the time when the power of the solid-stated drive was lost.

In other features, the control module is configured to upload the segments from the second memory into the first memory. The first metadata includes the uploaded segments. The uploaded segments include at least a full flush cycle of the segments prior to a flush event of LUT dependent metadata and prior to a time slot of the event log when power of a solid-state drive was lost. The control module is configured to walk the event log to update the first metadata from a time slot of a first one of the full flush cycle of the segments to the time slot of the event log when the power of the solid-state drive was lost. The power ON event is performed subsequent to the time when the power of the solid-stated drive was lost.

In other features, during the power ON event, the control module is configured to: upload a first segment of a full cycle of the segments from the second memory into the first memory; walk the event log from a first time slot to a time slot associated with a power down cycle of a solid-state drive including loading and updating the full cycle of the segments in the first memory based on entries of the event log; and while walking the event log from the first time slot to a time slot of one of the full cycle of the segments, skip an event log entry and refrain from updating an entry in the first memory associated with the skipped event log entry.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

A solid-state drive (SSD) may use a look up table (LUT) to track where each logical unit or block of data is stored physically in memory. The LUT may be an array or other suitable grouping of data with physical locations indexed by logical addresses. The LUT may be used to convert a logical address to a physical address when reading from and/or writing to memory. Out-dated (old) data in a physical location of the memory may be invalidated prior to writing updated (new) data to the physical location. The LUT is modified when outdated data is invalidated and updated data is written to the same location as the out-dated data or to a new physical location.

During each write operation of the memory, logical addresses may be dynamically mapped to physical addresses. The dynamic mapping refers to the assigning of physical addresses to logical addresses during write operations. Each time data is written to the memory, a logical address and a corresponding physical address of the data are recorded in the LUT. Due to the dynamic mapping, there is not a deterministic method to calculate a physical location of data. As a result, an updated and accurate LUT is needed to access previously stored data.

The LUT of a SSD may be stored in volatile memory and accessed from the volatile memory when the SSD is powered up (or powered ON). The LUT is stored in volatile memory for performance purposes (i.e. short access times). The LUT may be transferred from the volatile memory to non-volatile memory when the SSD is powered down (or powered OFF). The LUT is stored in the non-volatile memory prior to the SSD being in an OFF state.

During operation of the SSD, updated metadata of the LUT that is stored in the volatile memory may be lost when power is lost. Data storage systems are provided below that update and maintain a backup of the LUT prior to a loss in power. Also, when power is lost, the data storage systems restore the LUT to a state prior to a time when the loss in power occurred.

Figure 1:
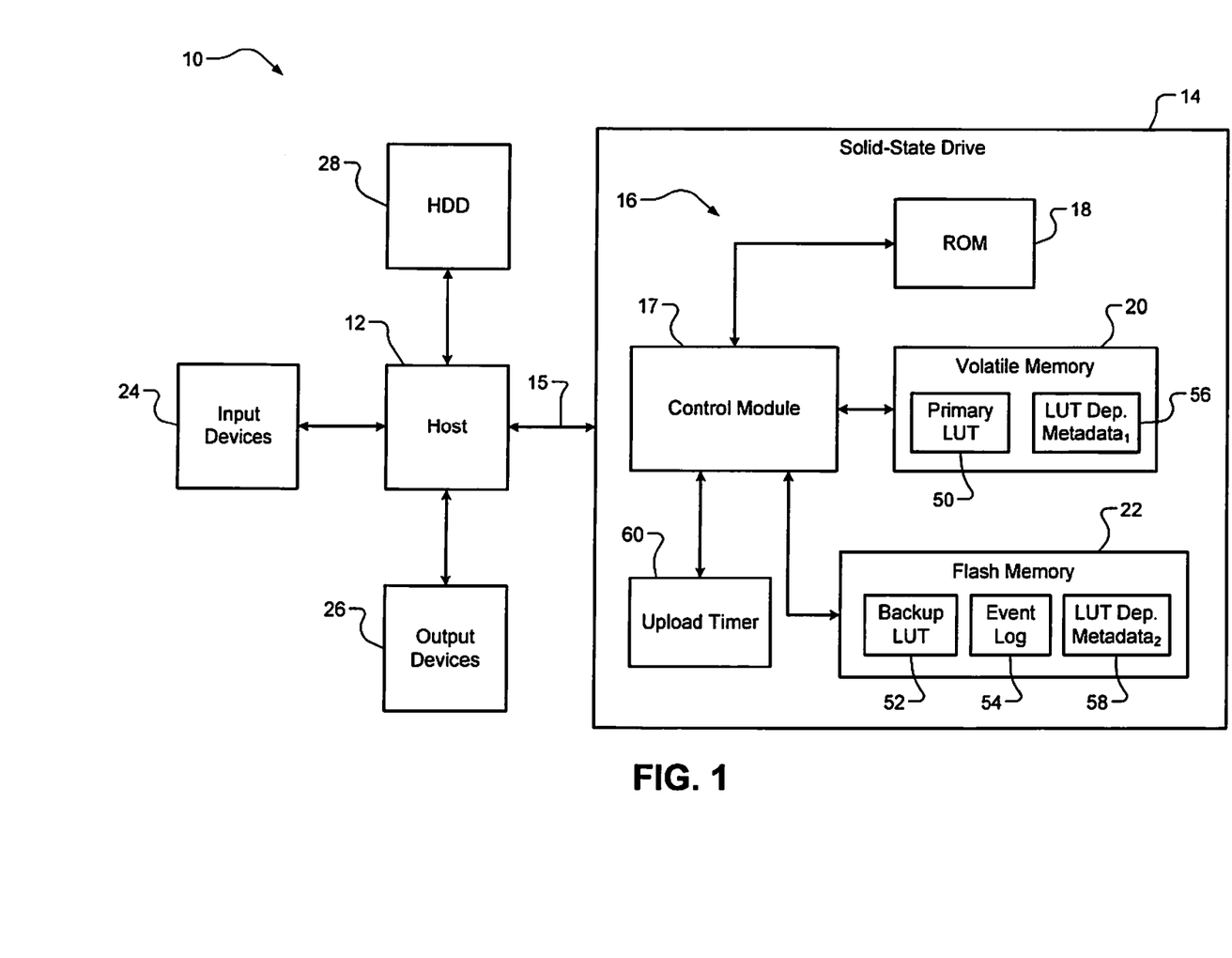
FIG. 1 is a functional block diagram of a data storage system in accordance with the present disclosure.

In FIG. 1, a data storage system 10 includes a host 12 and a SSD 14. The host 12 may be a computer, a media player, a mobile phone, a personal digital assistant, or other device that includes a SSD interface 15. The SSD 14 may be connected to and removed from the host 12. For example, the SSD 14 may be a flash drive. The host accesses memory of the SSD 14 via the SSD interface.

The SSD 14 includes a solid-state system 16 with a control module 17, read-only memory (ROM) 18, volatile memory 20 and flash (or non-volatile) memory 22. The control module 17 executes instructions of software and firmware of the SSD 14. For example, the control module 17 executes instructions of firmware stored in the ROM 18. The control module 17 may also read and execute instructions stored in the volatile memory 20. For example, the volatile memory 20 may include random access memory (RAM).

The data storage system 10 may also include input devices 24, output devices 26, and a hard disk drive (HDD) 28. The input devices 24 may include a keyboard or keypad, a mouse, a touch screen, a touch pad, a microphone, and/or other input devices. The output devices 26 may include a display, a speaker, and/or other output devices.

The data storage system 10 stores data in the SSD 14. The SSD 14 may emulate a HDD (e.g., the HDD 28). For example, data that is stored in the HDD 28 may also be stored in the SSD 14 (i.e. in the flash memory 22). Data is stored in the flash memory 22 according to a logical allocation address (LAA), which corresponds to a physical allocation address (PAA). The LAA is an address used by the host 12 to refer to a memory location within the flash memory 22. The PAA is an address of a physical location within the flash memory 22 and is used by the control module 17 to access the physical location.

The control module 17 processes commands according to the firmware stored in the ROM 18 to read and write data to the flash memory 22. For example, when the host 12 writes user data to a LAA of the flash memory 22, the control module 17 via firmware of the ROM 18 selects a corresponding PAA. The control module 17 stores the user data to a location of the flash memory 22 identified by the PAA and stores corresponding metadata in the volatile memory 20 and/or in the flash memory 22. The metadata indicates the relationship or mapping between the LAA and the corresponding PAA.

The metadata includes non-LUT dependent metadata and LUT dependent metadata. The non-LUT dependent metadata includes one or more LUTs with LAA-to-PAA associations. A primary LUT 50 that associates LAAs to PAAs is stored in the volatile memory 20. A backup version of the primary LUT 50 (referred to as the backup or secondary LUT 52) is stored in the flash memory 22. The primary LUT 50 associates each LAA of the flash memory 22 with an allocated PAA. If a particular LAA is not assigned to a PAA, the LAA may be associated with a recognizable invalid PAA value. The primary LUT 50 is flushed from the volatile memory 20 to the flash memory 22 prior to powering down the SSD 14. The terms "flush", "flushed" and "flushing" refer to downloading and saving at least a portion of a LUT from the volatile memory 20 to the flash memory 22.

The metadata that provides a mapping between LAAs and PAAs is referred to as non-LUT dependent metadata. LUT dependent metadata refers to metadata that is dependent upon the non-LUT dependent metadata. The LUT dependent metadata may also be stored in both the volatile memory 20 and the flash memory 22, as identified by respective numerical designators 56, 58. The LUT dependent metadata 56, 58 may include: pointers to user data and/or system data; data descriptions; defect information; how much data is in a block of memory (e.g., how much data is in a block of the flash memory 22) etc. The user data may refer to data provided from the host 12 and stored in the flash memory 22. The system data may refer to data generated when executing the firmware stored in the ROM 18. The data descriptions may include, for example, indications as to whether data is user data or system data. The defect information may include locations of defects within blocks of the flash memory 22.

During an access event (read event or write event), the host 12 provides a LAA to the control module 17 to access a location in the flash memory 22. The control module 17 accesses the primary LUT 50 to convert the LAA to a PAA. For example, when a read command requests data associated with a LAA, the data is actually retrieved from a corresponding PAA. The control module 17 then accesses the flash memory 22 at the PAA. The control module 17 may allocate an unused PAA to a LAA when, for example, writing data to the flash memory 22. The primary LUT 50 is updated to reflect the LAA-to-PAA association.

The non-LUT dependent metadata (primary LUT 50) stored in the volatile memory 20 is updated as data (e.g., user data) is written to the flash memory 22. Before the data storage system 10 is powered down, the metadata stored in the volatile memory 20 is transferred (flushed) to the flash memory 22. The metadata that is flushed may include LUT dependent metadata and non-LUT dependent metadata. The flushing of metadata may be performed periodically and/or at predetermined times and prior to powering down the data storage system 10 and/or the SSD 14.

Figure 3:
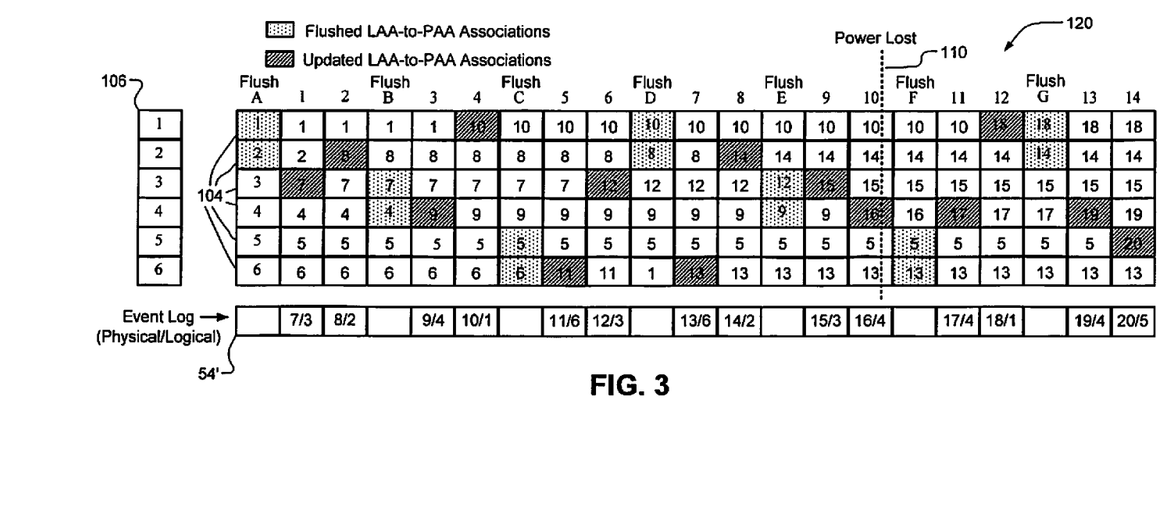
FIG. 3 is a LUT state diagram illustrating a sequence of LUT states based on a segmented flush cycle implementation in accordance with the present disclosure.
Figure 4:
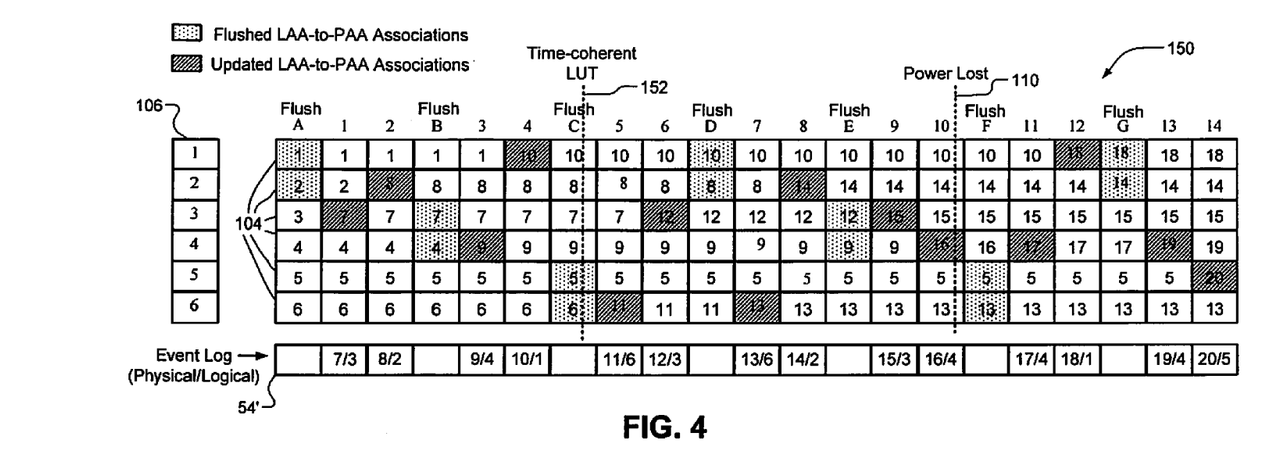
FIG. 4 is a LUT state diagram illustrating a time-coherent LUT time for a segmented flush cycle implementation in accordance with the present disclosure.

The backup LUT 52 and an event log 54 are used to upload and restore the primary LUT 50 subsequent to a loss in power. The event log 54 may be stored in the flash memory 22. An event log refers to a recording of address mapping changes to a LUT over time. For example, the primary LUT 50 includes a mapping of logical addresses to physical addresses for the flash memory 22. As cells and/or blocks of the flash memory 22 are accessed logical-to-physical address associations may be modified. The event log 54 is used to track the address mapping changes over time and may be used to recover a latest state of the primary LUT 50 in the event of a loss in power (e.g., a power outage). Each entry of the event log 54 may be associated with a change in a logical-to-physical address mapping for a particular time (or time slot). As an example, an entry of the event log 54 may include a logical address and a physical address that is assigned to that logical address. Examples of event log entries are shown in FIGS. 3 and 4. Frequency of metadata flushing may be adjusted based on predetermined backup time, event log size, load-up time, and/or recovery (or rebuild) time requirements. The backup time refers to the amount of time to flush the metadata (non-LUT dependent metadata and/or LUT dependent metadata) from the volatile memory 20 to the flash memory 22. The less often metadata is flushed from the volatile memory 20 to the flash memory 22, the longer the event log needed to recover the non-LUT dependent metadata. The more event log entries needed to recover the primary LUT 50, the longer the recovery time of the primary LUT 50.

The size of the event log 54 may refer to, for example, the number of LAA-to-PAA mapping change entries stored in the flash memory 22 and/or the length of one or more arrays dedicated to storing the LAA-to-PAA mapping changes. A portion of the flash memory 22 may be allocated for the event log 54. The size of that portion may be equal to the size of the event log 54 or a predetermined number of event log entries to assure restoration of the primary LUT 50.

The load-up time may refer to the time to transfer metadata (non-LUT dependent metadata and LUT dependent metadata) from the flash memory 22 to the volatile memory 20 upon power up of the SSD 14. The recovery time may include the load-up time and time to "walk the event log". The phrases "walk the event log" and "walking the event log" refer to updating the backup LUT 52 in the volatile memory 20 according to entries in the event log 54. This is described in further detail below.

During a power up procedure of the SSD 14, the non-dependent and dependent LUT metadata is transferred (uploaded) from the flash memory 22 to the volatile memory 20 to establish proper updated associations between the LAAs and the PAAs. During operation of the SSD 14, changes to the metadata stored in the volatile memory 20 are tracked in the event log 54. The metadata stored in the flash memory 22 is updated to reflect the same changes to the metadata stored in the volatile memory 20. The metadata in the flash memory 22 is segmented and updated at predetermined times and prior to powering OFF the SSD 14. For example, the metadata of the flash memory 22 may be updated in response to metadata save commands. The metadata save commands may be generated periodically and/or at predetermined times according to the firmware of the ROM 18.

During a power down of the SSD 14, the control module 17 may flush the entire volatile memory 20 including the primary LUT 50 into the flash memory 22. Upon powering up the SSD 14, the control module 17 may upload the backup LUT 52 to the volatile memory 20 and walk the event log 54 from a time of a flush event of the backup LUT 52 to the last entry in the event log 54 to assure that the backup LUT is updated with the latest changes.

When power is lost unexpectedly during operation of the SSD 14, changes made to the metadata stored in the volatile memory 20 may be lost. Since the metadata stored in the flash memory 22 is not updated prior to the SSD 14 being powered OFF, the metadata in the flash memory 22 may not include the latest changes to the primary LUT 50. For this reason, at least a portion of the metadata in the flash memory 22 may be old or out-dated. During a power up subsequent to the loss in power, the old metadata may be transferred from the flash memory 22 to the volatile memory 20. This can lead to improper allocation and retrieval of the user data in the flash memory 22. To correct the metadata in the volatile memory 20, the control module 14 walks the event log 54. In walking the event log 54, the control module updates the metadata stored in the volatile memory 20.

The SSD 14 may further include an upload timer 60. The upload timer 60 may be used to walk the event log 54. The upload timer 60 may refer to or point to a current entry of the event log 54 while walking the event log 54. This is further described with respect to the method of FIG. 8.

Figure 2:
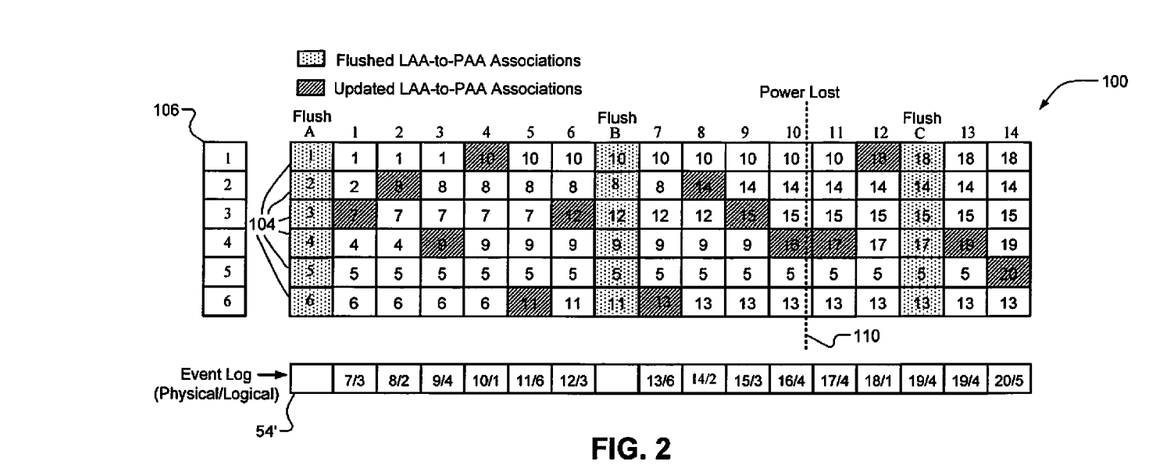
FIG. 2 is a look up table (LUT) state diagram illustrating a full cycle flush per allocated time slot implementation in accordance with the present disclosure.

Referring now to FIGS. 1 and 2, a look up table (LUT) state diagram 100 illustrates a full cycle flush per allocated time slot implementation. A "full cycle flush" refers to the flushing of each of the entries of a LUT at least once. The LUT state diagram 100 illustrates examples of states of the primary LUT 50 and an event log 54' at various times including time slots 1-14. Time increases from time slot 1 to time slot 14. An example of a state of the primary LUT 50 is shown for each of the time slots 1-14. The entries of the time slots 11-14 are shown as examples of entries should power not be lost during the time slot 10. Time slots 11-14 may not exist if power is lost during the time slot 10.

The primary LUT 50 is shown as including 6 entries 104, although the primary LUT 50 may include any number of entries. Each of the 6 entries 104 has an associated LAA and a PAA. The LAAs are represented by the numbers 1-6 and identified in a single column table 106. The PAAs are shown as entries in the primary LUT 50 for each of the time slots 1-14. For example, the PAAs are shown as 1, 2, 7, 4, 5, 6 for time slot 1. Similarly at time slot 10, the PAAs are shown as 10, 14, 15, 16, 5, 13. As a PAA is updated for a LAA, the corresponding entry in the primary LUT 50 is changed to reflect the update. For example, at time slot 2, the PAA for the second LAA is updated from 2 to 8.

Entries of the primary LUT 50 may be periodically and/or at predetermined times flushed to the flash memory 22. The primary LUT 50 may be entirely flushed from the volatile memory 20 to the flash memory 22 during each flush event. Three flush events A-C are shown in FIG. 2.

As an example and at power up, the primary LUT 50 may be initiated with PAAs 1-6. At time slot 1, PAA 3 is replaced with PAA 7 for LAA 3. Next, PAA 8 replaces PAA 2 for LAA 2 at time slot 2. One or more entries may be updated for each of the time slots 1-14. At a first flush FLUSH A, the primary LUT has PAA entries 1, 2, 3, 4, 5, 6. At a second flush FLUSH B, the primary LUT has PAA entries 10, 8, 12, 9, 5, and 11. At a third flush FLUSH C, the primary LUT has PAA entries 18, 14, 15, 17, 5, and 13.

If power is lost during, for example, time slot 10 (designated by dashed line 110), the primary LUT 50 may be restored on a next power ON of the SSD 14. The last saved version of the primary LUT (10, 8, 12, 9, 5, 11) may be uploaded from the flash memory 22 to the volatile memory 20. The control module 17 may walk the event log 54' from a time that the primary LUT 50 was last saved to the time slot 10 to rebuild the primary LUT 50. The primary LUT 50 is updated according to each entry in the event log 54'. The end result of walking the event log 54' is a primary LUT with the entries that existed when the power was lost (or e.g., 10, 14, 15, 16, 5, 13).

Backing up an entire primary LUT during a single flush event halts operation of the host 12. Writing to the flash memory 22 by the host 12 is halted during updating of the backup LUT 52. The host 12 is halted to prevent the primary LUT 50 from being modified while the primary LUT 50 is being flushed to update the entire backup LUT 52. The control module 17 may perform segmented flushes to minimize the amount of time that the host 12 is halted during a flush event. Examples of segmented flushes are shown and further described with respect to FIGS. 3-8.

Referring now to FIGS. 1 and 3, a LUT state diagram 120 illustrates a sequence of LUT states based on a segmented flush cycle implementation. A segmented flush refers to flushing a portion of the primary LUT 50 to the backup LUT 52 during a flush event. A segment may include one or more entries of the primary LUT 50. The primary LUT 50 may be divided into any number of segments and the frequency and order of updating each of the segments may be adjusted.

The LUT state diagram 120 illustrates the state of the primary LUT 50 at various times including the time slots 1-14. The primary LUT 50 is shown as including the 6 entries 104. Each of the 6 entries has an associated LAA and a PAA. The LAAs are represented by the numbers 1-6 and identified in the single column table 106. The PAAs are shown in the primary LUT 50 for each of the time slots 1-14.

The LUT state diagram 120 of FIG. 3 is similar to the state diagram 100 of FIG. 2, except the LUT state diagram 120 includes segmented flush events. Each segmented flush event, as shown, includes flushing 1/3 of the primary LUT 50 to the flash memory 22. The primary LUT 50 of FIG. 3 subsequent to completing 4 flush events is the same as the primary LUT 50 of FIG. 2 subsequent to completing 2 flush events (i.e. primary LUT entries at FLUSH B of FIG. 2 and at FLUSH D of FIG. 3 are 10, 8, 12, 9, 5, 11).

Segmented flush events FLUSH A-G are shown between respective time slots. For the implementation shown, a flush event is performed for each set of two time slots (or 1 flush event per 2 time slots). Two of the six primary LUT entries are flushed during each flush event. For example, in the flush event FLUSH A the segment with LAAs 1, 2 and PAAs 1, 2 are flushed. This provides an updated backup of the flushed segment in the flash memory.

Segmented flushing of the primary LUT 50 minimizes a reduction in instantaneous host performance during flush events. By breaking up a full cycle flush into several smaller sized or segmented flush events, the amount of time that a host is halted during each flush event is reduced or eliminated. Also, an average host throughput can be maintained with smaller flush segments and while minimizing a reduction in host performance. The frequency that each segment is flushed using the implementation of FIG. 3 may be greater than the frequency at which a full cycle or entire LUT is flushed using the implementation of FIG. 2.

Host write requests to logical and physical addresses that are not associated with a segment being flushed may be performed during a flush event. For example, portions of the backup LUT 52 may be updated while metadata is written to LAAs and/or PAAs of other portions of the backup LUT and user data is written to the flash memory 22. In other words, data may be written to LAAs and/or corresponding PAAs of the flash memory 22 that do not have corresponding backup LUT entries that are being updated by a flush event. For example, LAAs and PAAs 3-6 of the flash memory 22 may be written to during the flush event FLUSH A. Host write requests to logical and physical addresses associated with a segment being flushed may be halted while the segment is flushed. The host 12 is prevented from writing to LAAs and/or PAAs of the flash memory 22, which are being backed up during the flush events. This prevents writing to certain LAAs and PAAs of the flash memory 22 while the mapping associations for the LAAs and PAAs are being backed up in the backup LUT 52.

If power is lost at, for example, time slot 10 (designated by the dashed line 110), the primary LUT 50 is rebuilt. The primary LUT 50 is rebuilt based on the backup LUT 52 and the event log 54' during a next power ON event. If the control module 17 uploaded the saved segments from the flash memory 22 to the volatile memory 20 without walking the event log 54', the resulting LUT would be a combination of entries at different times (e.g., entries 10, 8, 12, 9, 5, 6 for FLUSHES C, D, E). The resulting LUT would not be a correct representation for any time slot (i.e. the resulting LUT is not time-coherent).

A LUT that is not time-coherent cannot be used during a rebuild process of LUT dependent metadata. To solve this issue, a history of updated entries of the primary LUT 50 and/or a history of flushed segments is maintained via the event log 54'. The control module uses the event log 54' based on a restore algorithm to rebuild the primary LUT 50 to a time-coherent state. The primary LUT 50 is updated to the time-coherent state prior to using the primary LUT 50 to rebuild LUT dependent metadata. The restore algorithm may be stored in the flash memory 22 and uploaded to the volatile memory 20 during a power ON event and/or stored in the ROM 18. The restore algorithm is executed by the control module 17.

During a rebuild of the primary LUT 50, the backup LUT 52 is uploaded to volatile memory 20 to provide the primary LUT 50. Since the segments of the backup LUT 52 are flushed at different time slots, the segments represent states of different parts of a LUT at different times. As a result, the primary LUT 50 is not in a time-coherent state when initially uploaded. To change the state of the primary LUT 50 to a time-coherent state, the control module 17 walks the event log 54' to update the entries of the primary LUT 50. The event log 54' may be stored in the flash memory 22 and includes LAA-to-PAA association changes in an order in which the changes previously occurred. Entries in the primary LUT 50 are changed according to the event log 54' and thus in the order that the entries were previously updated prior to the loss in power. Each entry in the event log 54' includes a new PAA for a particular LAA. The new PAA is shown in the respective updated state of the primary LUT 50 for a corresponding time slot.

Figure 5:
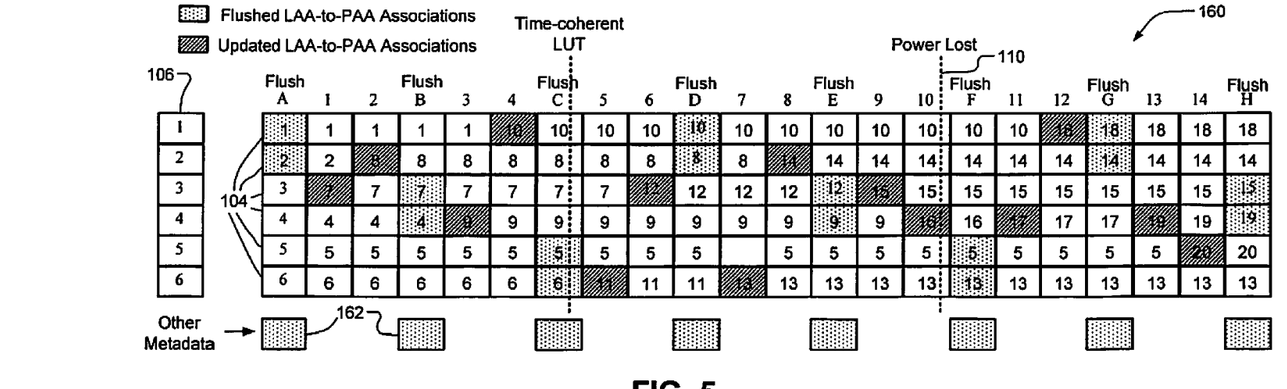
FIG. 5 is a LUT state diagram illustrating synchronized non-LUT dependent and LUT dependent metadata flush timing for a segmented flush cycle implementation in accordance with the present disclosure.
Figure 6:
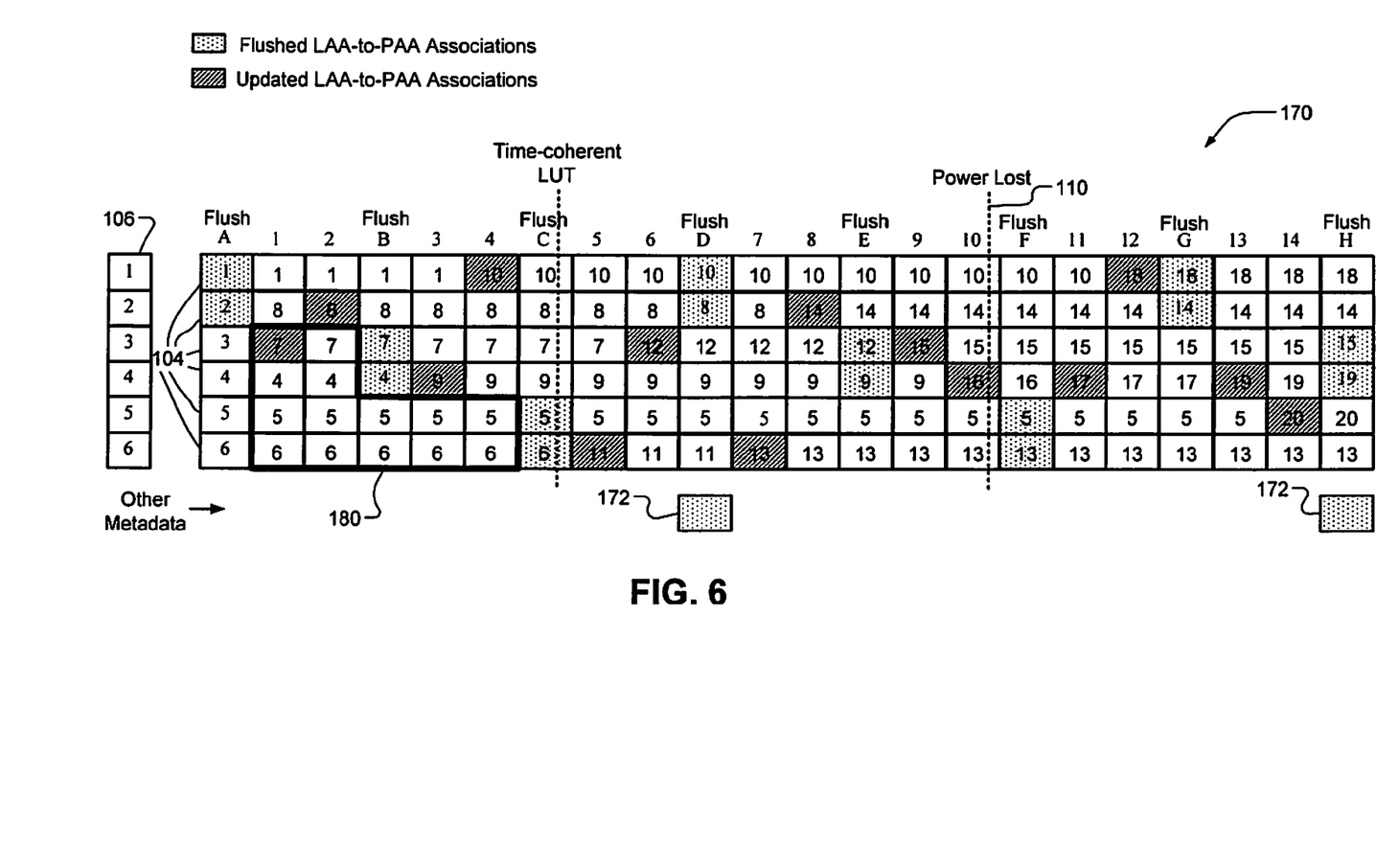
FIG. 6 is a LUT state diagram illustrating dedicated LUT dependent metadata flush timing for a segmented flush cycle implementation in accordance with the present disclosure.

FIGS. 2 and 3 show flushing of primary LUT entries (or non-LUT dependent metadata). In addition to the non-LUT dependent metadata, LUT dependent metadata (or time-varying metadata) may also be flushed during operation of the SSD 14. Examples of LUT dependent metadata flush events are shown in FIGS. 5 and 6. The LUT dependent metadata may also be restored subsequent to a loss in power and include walking the event log 54'.

The event log 54' may be walked to recover LUT dependent metadata subsequent to establishing a time-coherent LUT in the volatile memory 20. A time-coherent LUT is established by determining a start time to start walking the event log 54' and upload at least a full cycle of segments. The control module 17 walks the event log from the start time to provide a time-coherent LUT in the volatile memory 20 prior to uploading the LUT dependent metadata. A time-coherent LUT is provided at a time when the event log 54' has been walked at least a full cycle of segments. As an example, a start time may be associated with FLUSH C. The primary LUT 50 may be in a time-coherent state subsequent to walking the event log to a time associated with FLUSH E.

While walking the event log 54', the control module 17 updates entries in the primary LUT 50 based on the entries in the event log 54' and/or based on the segments of the backup LUT 52. The entries in the primary LUT 50 are updated in the order in which the entries were previously updated in the event log 54'. Once the time-coherent LUT is established, the LUT dependent metadata may be updated based on each entry in the event log subsequent to the time when the time-coherent LUT is established. For example, assuming that a time-coherent LUT has been established as of the time of FLUSH E, the control module 17 may continue walking the event log 54' subsequent to FLUSH E to modify primary LUT entries and LUT dependent metadata.

Referring now to FIGS. 1 and 4, a LUT state diagram 150 illustrates a time-coherent LUT time for a segmented flush cycle implementation. The LUT state diagram 150 illustrates the state of a primary LUT 50 at various times including the time slots 1-14. The primary LUT 50 is shown as including the 6 entries 104, although the primary LUT 50 may include any number of entries. Each of the 6 entries 104 has an associated LAA and a PAA. The LAAs are represented by the numbers 1-6 and identified in the single column table 106.

There are several methods of flushing the non-LUT dependent metadata in cooperation with segmented LUT flushes. Each of the methods can affect the rebuild process of the primary LUT 50 differently. FIG. 4 illustrates a maximum number of LUT segments and event log entries stored to provide a time-coherent LUT for LUT dependent metadata restoration for a primary LUT with six entries.

Assuming that the LUT dependent metadata is restored once every other full cycle of flush events (or approximately once every 5 segmented flushes), at least 5 segmented flush events (or 2 times the number of segments in a full cycle minus 1) of event log entries are saved. In other words, the segments of FLUSHES A-E are saved to the flash memory 22 including primary LUT changes during time slots between FLUSH A and FLUSH E. Primary LUT changes subsequent to the FLUSHES A-E and prior to the time slot when power was lost (i.e. time slot 10) are also saved to the flash memory 22. The storing of 5 segmented entries may be considered a "worst case" example for a LUT table with 3 segments. The number of segmented entries may be less than 5 based on when the LUT dependent metadata is last flushed.

The control module 17 may use the rebuild algorithm and/or rebuild firmware to refer back to FLUSH A as a starting point to begin walking the event log 54'. The control module 17 may upload the segment for FLUSH A from the flash memory 22 to the volatile memory 20 and then walk the event log 54' starting at time slot 1 to modify entries in the primary LUT 50. The time of FLUSH A is one segment less than two full flush cycles from the end of the event log or the time when power was lost. A flush algorithm may store at least one segment less than two full cycles in the flash memory 22 during operation of the SSD 14. The flash algorithm may be stored in the flash memory 22 and uploaded to the volatile memory 20 during a power ON event and/or stored in the ROM 18.

Following the uploading of the segment for FLUSH A, the control module 17 walks the event log 54' to load up the next changes, such as the address change associations of LAAs 2, 3 to PAAs 8, 7 at time slots 1, 2. The segment for FLUSH B is then uploaded followed by walking the event log 54' for address change associations of LAAs 1, 4 to PAAs 10, 9 at time slots 4, 3. As segments are uploaded and changes to the primary LUT 50 are performed based on the event log 54', entries in the primary LUT 50 (or RAM) are overwritten. To complete a full cycle, the segment of the primary LUT 50 for FLUSH C is overwritten. At this point (designated by dashed line 152), the primary LUT 50 is time-coherent and has entry values of 10, 8, 7, 9, 5, 6.

LUT dependent metadata may be restored based on the time-coherent LUT. The LUT dependent metadata may be further updated based on event log entries beginning at the time of FLUSH C or the time slot adjacent and subsequent to FLUSH C. The LUT dependent metadata may be updated by walking the event log 54' from, for example, time slot 5 to time slot 10.

The segments of FLUSHES D and E may not be uploaded while walking the remainder of the event log 54' to update the primary LUT 50. For example, the segments of FLUSHES D and E may not be uploaded as the addresses associated with FLUSHES D and E are obtained from the event log 54' in association with time slots prior to FLUSHES D and E (e.g., time slots 2, 3, 4, and 6 provide the changes reflected in FLUSHES D and E). For this reason, the tasks of uploading FLUSHES D and E would be redundant with walking the event log 54'.

If LUT dependent metadata does not exist, only one full flush cycle of segments may be saved and uploaded during a power ON event. For example, FLUSHES C, D and E may be previously stored and uploaded during a power ON event when power is lost at time slot 10. This provides a full cycle of flush segments to rebuild the primary LUT. Flush segments (FLUSHES A, B) prior to FLUSH segment C are not needed when LUT dependent metadata does not exist.

Referring now to FIGS. 1 and 5, a LUT state diagram 160 illustrates synchronized non-LUT dependent and LUT dependent metadata flush timing for a segmented flush cycle implementation. The LUT state diagram 160 illustrates the state of the primary LUT 50 at various times including the time slots 1-14. The primary LUT 50 is shown as including the 6 entries 104. Each of the 6 entries 104 has an associated LAA and a PAA. The LAAs are represented by the numbers 1-6 and identified in the single column table 106.

LUT dependent metadata (represented by boxes 162) is flushed during each segmented flush event. By flushing the LUT dependent metadata during each flush event, the control module 17 is able to provide a time-coherent LUT by referring back to only one full flush cycle of segments during recovery of the primary LUT 50. Because the LUT dependent metadata is available at the time of, for example, the segment of FLUSH E, a time-coherent LUT can be established. The time-coherent LUT can be established by loading the segments of FLUSH C through FLUSH E and walking the event log 54' from FLUSH C to the end of the event log 54' (or to the event log entry associated with a loss in power).

Referring now to FIGS. 1 and 6, a LUT state diagram 170 illustrates dedicated dependent metadata flush timing for a segmented flush cycle implementation. The LUT state diagram 170 illustrates the state of the primary LUT 50 at various times including the time slots 1-14. The primary LUT 50 is shown as including the 6 entries 104. Each of the 6 entries 104 has an associated LAA and a PAA. The LAAs are represented by the numbers 1-6 and identified in the single column table 106.

The implementation of FIG. 6 includes flushing LUT dependent metadata at dedicated times, represented by boxes 172. The LUT dependent metadata may be flushed when certain LAA-to-PAA address associations (e.g., associations in rows 3-6 and at time slot 6) of the primary LUT 50 (or non-LUT dependent metadata) are not flushed and when other LAA-to-PAA address associations (e.g., associations in rows 1 and 2 and at time slot 6) of the primary LUT 50 are flushed. As an alternative, non-LUT dependent metadata and LUT dependent metadata may have respective flush times. As an example, the non-LUT dependent metadata may be flushed prior to or subsequent to the flushing of the LUT dependent metadata. Providing dedicated flush times for non-LUT dependent metadata and LUT dependent metadata reduces the amount of time to perform each flush.

In the implementation shown, the control module 17 using the rebuild algorithm starts rebuilding the primary LUT 50 from the segment of FLUSH A in order to establish a time-coherent LUT by FLUSH D. This provides a time-coherent LUT to rebuild the LUT dependent metadata beginning at the time of FLUSH D. FLUSH D refers to the most recent flush of the LUT dependent metadata since the loss in power (or power cycle).

As another alternative implementation, when LUT dependent metadata exists in the flash memory 22, segments of FLUSHES A-C may be uploaded during the same time period and/or simultaneously. The event log 54' may be walked starting at the time of FLUSH A and subsequent to uploading the segments of FLUSHES A-C. Although the primary LUT is inaccurate initially when the segments of FLUSHES A-C are uploaded, the act of walking the event log 54' provides a time-coherent LUT beginning at the time of FLUSH C and corrects entries of the primary LUT 50 to provide a restored LUT at time slot 10. The event log 54' includes changes in logical-to-physical address mapping for a particular time, as described above. Walking the event log includes updating (or replacing) entries in the primary LUT 50 with entries in the event log 54'. Values of the LUT dependent metadata may be updated based on the updated entries in the primary LUT 50. The values updated may include: pointers to user data and/or system data; data descriptors; defect information; how much data is in a block of memory etc.

As another implementation to save time and resources, entries of the event log may be skipped when rebuilding the primary LUT 50. For example, in FIG. 6, subsequent to uploading the segment of FLUSH A, the change at time slot 1 may be skipped. Since the PAA change from 3 to 7 for LAA 3 is overwritten by uploading the segment for FLUSH B, the change associated with time slot 1 may be skipped. As another example, the segments in the outlined area 180 may be skipped, as these segments are accounted for by FLUSH B and FLUSH C.

The event log entries that were updated prior to the loss in power and subsequent to the time when of the LUT dependent metadata was last flushed may not be skipped. For example, the event log entries updated during time slots 7-10 may not be skipped, as the LUT dependent metadata may be updated based on changes to the primary LUT 50 at during each of the time slots 7-10. If one of these event log entries were to be skipped the resulting LUT dependent metadata may not reflect all changes and as a result be inaccurate.

Figure 7:
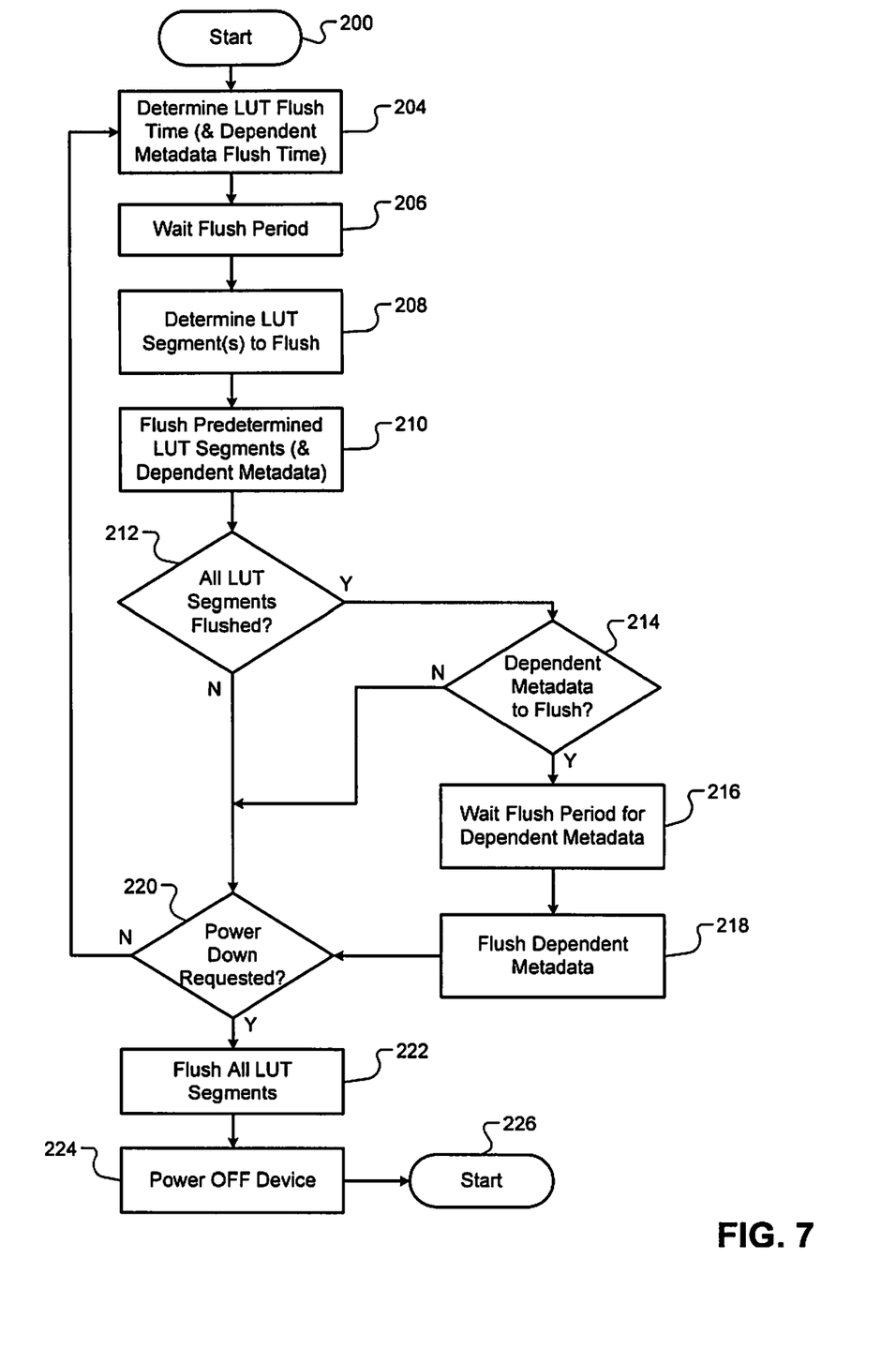
FIG. 7 illustrates a method of updating and backing up a LUT in accordance with the present disclosure.
Figure 8:
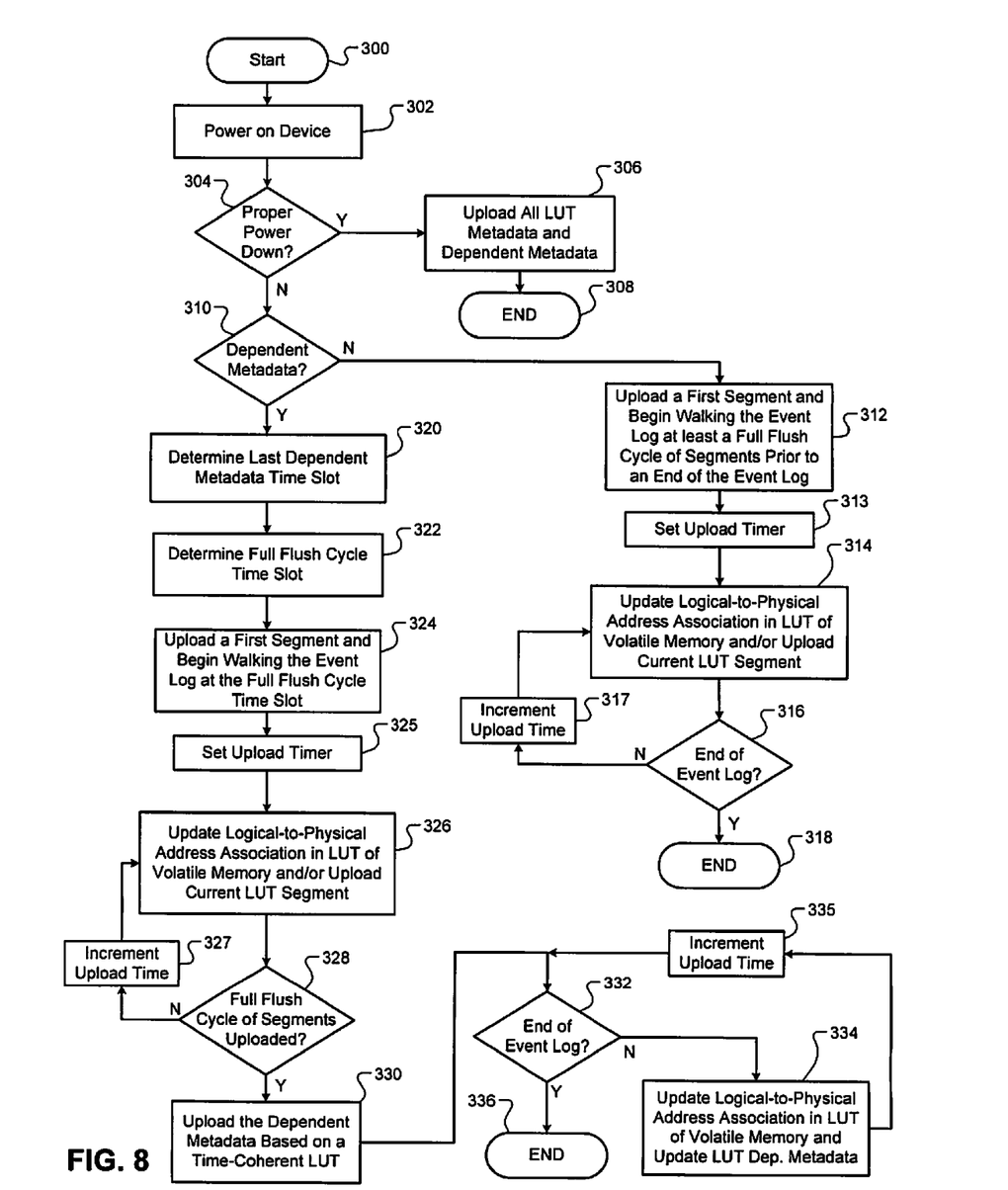
FIG. 8 illustrates a method of recovering a LUT in accordance with the present disclosure.

The data storage system 10 of FIG. 1 may be operated using numerous methods, example methods are provided by the methods of FIGS. 7 and 8. In FIG. 7, a method of updating and backing up a LUT is shown. Although the following tasks are primarily described with respect to the implementations of FIGS. 1 and 5-6, the tasks may be easily modified to apply to other implementations of the present disclosure. The tasks may be iteratively performed. The method may begin at 200.

At 204, the control module 17 determines a LUT flush time. The LUT flush time may be a next time to flush a segment of the primary LUT 50 to the backup LUT 52. The control module 17 may determine the flush time based on a periodic flush interval or flush period. A flush period refers to the time between segmented flush events. The flush time and/or the flush period may be determined based on the number of LUT segments in a full flush cycle, a startup recovery time, a maximum host latency time, etc.

The startup recovery time refers to the time to recover the primary LUT 50 subsequent to a loss in power and during a power ON event. The longer the flush period, the more entries that are saved in the event log 54 to recover the primary LUT 50. The more entries of the event log 54 that are processed to recover the primary LUT 50, the longer the startup recovery time. Also, the longer the flush period, the less often a flush is performed. The less often a flush is performed, the more entries of the primary LUT 50 that are flushed during a single flush event and/or the more entries of the event log 54 that are processed to recover the primary LUT 50. The more entries of the primary LUT 50 that are flushed during a single flush event, the more host latency time (or time that the host is halted) that may be experienced during a flush event. At 204, the flush time and/or flush period of LUT dependent metadata may also be determined. The flush time and/or flush period of LUT dependent metadata may be determined based on the flush time and/or flush period of the non-LUT dependent metadata. For example, the flush times of the LUT dependent metadata may be set to be the same as or different than the flush times of the non-LUT dependent metadata.

At 206, the control module 17 may wait the flush period of the non-LUT dependent metadata and/or the flush period of the LUT dependent metadata prior to proceeding to task 208. At 208, the control module 17 may determine one or more LUT segment(s) to flush and/or whether to flush LUT dependent metadata. The control module 17 may cycle through segments of the primary LUT 50 in a predetermined order and determine a next flush segment based on segments previously flushed.

At 210, the control module 17 flushes the selected segments and/or the LUT dependent metadata. The LUT dependent metadata may be flushed when the non-LUT dependent metadata is flushed, as shown in FIG. 5. At 212, and based on the implementation of FIG. 6, the control module 17 determines whether all of the segments of the primary LUT 50 have been flushed. Task 214 is performed when all of the segments have been flushed, otherwise task 220 is performed.

At task 214, the control module 17 determines whether there is LUT dependent metadata to be flushed. Task 216 is performed when there is LUT dependent metadata to be flushed, otherwise task 220 is performed. At 216, the control module 17 may wait the flush period of the LUT dependent metadata before performing task 218. At task 218, the LUT dependent metadata is flushed.

At 220, the control module 17 determines whether there is a power down request. Task 222 is performed when a power down request is received, otherwise the control module 17 may return to task 204. At 222, all of the LUT segments are flushed from the volatile memory 20 to the flash memory 22 to update the backup LUT 52 prior to a power down event. At 224, the SSD 14 is powered OFF. The method may end at 226.

In FIG. 8, a method of recovering a LUT is shown. Although the following tasks are primarily described with respect to the implementations of FIGS. 1 and 5-6, the tasks may be easily modified to apply to other implementations of the present disclosure. The tasks may be iteratively performed. The method may begin at 300.

At 302, the SSD 14 is powered ON. At 304, the control module 17 determines whether the SSD 14 was properly powered down. The SSD 14 is properly powered down when the entire primary LUT 50 is flushed (downloaded) to the flash memory 52 prior to the SSD 14 being powered down and no changes are made to the primary LUT subsequent to the download. The control module 17 may determine that a proper power down has occurred based on the entries in the event log 54 as compared to the entries in the backup LUT 52. For example, if a last predetermined number of entries (e.g., the number of entries associated with a full cycle of flushed segments) in the event log 54 are reflected in the backup LUT 52, a proper power down of the SSD 14 has occurred. Task 306 is performed when the SSD 14 was properly powered down, otherwise task 310 is performed.

At 306, the control module 17 uploads all of the non-LUT dependent metadata and the LUT dependent metadata from the flash memory 22 to the volatile memory 20. The method may end at 308.

At 310, the control module 17 determines whether there is LUT dependent metadata. Task 312 is performed when there is not LUT dependent metadata, otherwise task 320 is performed.

At 312, the control module 17 uploads a first segment of the backup LUT 52 and begins walking the event log 54 from a time when the first (uploaded) segment was last flushed. The first segment is a segment at least a full flush cycle prior to an end of the event log 54. At 313, the upload timer 60 may be set and used to point to a current entry of the event log 54. An initial upload time of the upload timer 60 may correspond to a time of the first segment and/or the time slot adjacent and subsequent to the first segment.

At 314, logical-to-physical address association(s) in the primary LUT 50 are updated for the upload time and based on the event log 54 and/or a next LUT segment is uploaded from the flash memory 22 to the volatile memory 20. At 316, the control module 17 determines whether the end of the event log 54 has been reached. If the end of the event log 54 has not been reached, task 317 is performed, otherwise the method may end at 318. At 317, the upload time may be incremented to refer to a next time slot or time of a flush segment.

At task 320, the control module 17 determines a time (or time slot) when LUT dependent metadata was last flushed prior to the loss in power. This time may be referred to as the last dependent metadata time slot. At 322, the control module 17 determines a time slot that is at least a full flush cycle prior to the last dependent metadata time slot. This time slot may be referred to as the full flush cycle time slot.

At 324, the control module 17 may upload a first segment prior to the full flush cycle time slot and begin walking the event log 54 at the full flush cycle time slot. At 325, the upload timer 60 may be set and used to point to a current entry of the event log 54. An initial upload time of the upload timer 60 may correspond to a time of the first segment and/or the time slot adjacent and subsequent to the first segment. At 326, logical-to-physical address association(s) in the primary LUT 50 are updated for the upload time and based on the event log 54 and/or a next LUT segment is uploaded from the flash memory 22 to the volatile memory 20.

At 328, the control module 17 determines whether a full cycle of segments are uploaded. Task 327 is performed when a full cycle of segments is not uploaded, otherwise task 320 is performed. A time-coherent LUT exists in the volatile memory 20 when the full flush cycle of segments has been uploaded and the control module 17 has walked the event log 54 from the first segment to a last segment of the full cycle of segments. For example, in FIG. 6 the first segment may be associated with FLUSH A and the last segment may be associated with FLUSH C. The primary LUT 50 obtained from walking the event log 54 from the time of FLUSH A to the time of FLUSH C is a time-coherent LUT.

At 330, the LUT dependent metadata is uploaded based on the time-coherent LUT. At 332, the control module 17 determines whether the end of the event log 54 has been reached. Task 334 is performed when the end of the event log 54 has not been reached, otherwise the method may end at 336. At 334, the control module 17 updates logical-physical address associations in the primary LUT 50 based on the event log 54 and/or updates LUT dependent metadata based on the event log 54. At 335, the upload timer 60 is incremented.

The above-described tasks of FIGS. 7 and 8 are meant to be illustrative examples; the tasks may be performed sequentially, synchronously, simultaneously, continuously, during overlapping time periods or in a different order depending upon the application.

The above-described implementations provide a LUT that is stored in RAM. Data of the LUT may be erased and/or lost when power is lost. In order to restore the data of the LUT, the above-described implementations maintain a backup LUT and an event log in non-volatile memory. The backup LUT may be periodically updated prior to the loss in power. The LUT is restored in the RAM based on the backup LUT and the event log. The LUT is restored in the RAM to a latest state of the LUT prior to the loss in power by walking the event log. This minimizes host latency time associated with writing data to the non-volatile memory while backing up the LUT. In addition to backing up and restoring the LUT, other metadata (i.e. the LUT dependent metadata) is also backed up and restored.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A system comprising:
a first memory configured to store a first lookup table with first metadata, wherein the first metadata includes a first mapping between logical addresses and physical addresses, and wherein the first metadata is susceptible to being lost due to an unexpected power down event;
a second memory configured to store (i) a second lookup table with second metadata, and (ii) an event log, wherein the second metadata includes a second mapping between the logical addresses and the physical addresses, wherein the event log comprises a plurality of entries, wherein the second memory is configured to store in the event log each of the plurality of entries, such that each of the plurality of entries indicates an updated association between a respective one of the logical addresses and a corresponding one of the physical addresses as included in the first metadata prior to the unexpected power down event; and a control module configured to
prior to the unexpected power down event, perform segmented flushes, wherein each of the segmented flushes includes updating one or more entries of a segment of the second metadata with a corresponding one or more entries of a segment of the first metadata, and wherein each of the segmented flushes includes updating one or more entries that are different than the one or more entries of each of other segmented flushes, and as a result of the unexpected power down event, process the event log entry-by-entry in a successive order beginning at a first entry and stopping at a second entry to recover, based on the second metadata and the entries in the event log from the first entry to the second entry, a single full flush cycle of segments of the first metadata in the first memory, wherein the control module is configured to, while processing the event log from the first entry to the second entry, (i) skip an entry in the event log between the first entry and the second entry, and (ii) refrain from updating a segment of the first metadata associated with the skipped entry, the skipped entry of the event log corresponds to an entry of the first metadata last updated (i) during or subsequent to a first one of the segmented flushes, and (ii) prior to the unexpected power down event, the first one of the segmented flushes occurred prior to the other ones of the segmented flushes, the processing of the event log to recover the single full flush cycle of segments of the first metadata includes, based on the event log, updating each of the entries of the segment of the second metadata to recover one or more last modified entries of a corresponding one or more segments of the first metadata, the control module is configured to update each of the one or more last modified entries of the first metadata subsequent to a corresponding one of the segmented flushes being performed and prior to the unexpected power down event, the first entry is a predetermined number of entries prior to the second entry, the unexpected power down event occurs during or after storing the second entry in the second memory, and the predetermined number of entries corresponds to recovering the single full flush cycle of segments.

2. The system of claim 1, wherein:
the skipped entry comprises a logical-to-physical address association and corresponds to a first time slot;
a third entry of the event log comprises the logical-to-physical address of the skipped entry and corresponds to a second time slot; and
the second time slot is subsequent to the first time slot.

3. The system of claim 1, wherein each of the segmented flushes includes updating a first plurality of physical address associations of a plurality of logical addresses in the second lookup table with a second plurality of physical address associations of the plurality of logical addresses indicated in the first lookup table.

4. The system of claim 1, wherein:
the second memory is configured to store third metadata;
the third metadata is (i) different than the first metadata and the second metadata, and (ii) determined based on values of the first metadata or the second metadata; and
the control module is configured to (i) as a result of the unexpected power down event, determine whether a segment of the third metadata is stored in the second memory, and (ii) if the segment of the third metadata is stored in the second memory and while processing the event log, recover the first metadata based on a time slot corresponding to the segment of the third metadata.

5. The system of claim 4, wherein the control module is configured to:
if the segment of the third metadata is stored in the second memory,
increment an upload timer if a full flush cycle of segments since the unexpected power down event has not been uploaded, and
upload the segment of the third metadata based on the first lookup table if a full flush cycle of segments since the unexpected power down event has been uploaded; and
increment the upload timer if (i) the segment of the third metadata is not stored in the second memory, and (ii) an end of the event log has not been reached.

6. The system of claim 5, wherein the control module is configured to, if the end of the event log has not been reached, recover (i) the third metadata, and (ii) some logical-to-physical address associations in the first lookup table based on corresponding entries in the event log.

7. The system of claim 4, wherein:
the third metadata includes information regarding the first metadata or the second metadata; and
the information regarding the first metadata or the second metadata comprises pointers of user data, pointers of system data, amounts of data stored in blocks of the first memory or the second memory, and defect information.

8. The system of claim 1, wherein the control module is configured to:
determine whether a proper power down of the system has occurred, wherein a proper power down occurs when the first lookup table is flushed to the second memory prior to a last power down event of the system;
in response to a proper power down of the system occurring, (i) transfer the second metadata from the second memory to the first memory, and (ii) refrain from processing the event log; and
in response to a proper power down of the system having not occurred, (i) transfer the second metadata from the second memory to the first memory, and (ii) process the event log.

9. The system of claim 1, further comprising a solid-state drive comprising the first memory and the second memory, wherein:
the first memory includes volatile memory; and
the second memory includes non-volatile memory.

10. The system of claim 1, wherein:
each of the one or more segments of the first metadata refers to a respective column of the first lookup table; and
the segment of the second metadata refers to a column of the second lookup table.

11. The system of claim 1, wherein:
the entry of the first metadata, corresponding to the skipped entry of the event log, was last updated prior to a second one of the segmented flushes; and
the second one of the segmented flushes occurred subsequent to the first one of the segmented flushes.

12. The system of claim 1, wherein the skipped entry of the event log corresponds to (i) a segment of the first metadata that was not updated for a period of the skipped entry, or (ii) an entry of the first metadata that was updated prior to a corresponding one of the segmented flushes.

13. A method comprising:
storing a first lookup table with first metadata in a first memory, wherein the first metadata includes a first mapping between logical addresses and physical addresses, and wherein the first metadata is susceptible to being lost due to an unexpected power down event;
storing in a second memory (i) a second lookup table with second metadata, and (ii) an event log, wherein the second metadata includes a second mapping between the logical addresses and the physical addresses, wherein the event log comprises a plurality of entries, wherein each of the plurality of entries indicates an updated association between a respective one of the logical addresses and a corresponding one of the physical addresses as included in the first metadata prior to the unexpected power down event;
prior to the unexpected power down event, performing segmented flushes, wherein each of the segmented flushes includes updating one or more entries of a segment of the second metadata with a corresponding one or more entries of a segment of the first metadata, and wherein each of the segmented flushes includes updating one or more entries that are different than the one or more entries of each of the other segmented flushes;
as a result of the unexpected power down event, processing the event log entry-by-entry in a successive order beginning at a first entry and stopping at a second entry to recover, based on the second metadata and the entries in the event log from the first entry to the second entry, a single full flush cycle of segments of the first metadata in the first memory; and
while processing the event log from the first entry to the second entry, (i) skipping an entry in the event log between the first entry and the second entry, and (ii) refraining from updating a segment of the first metadata associated with the skipped entry,
wherein
the skipped entry of the event log corresponds to an entry of the first metadata last updated (i) during or subsequent to a first one of the segmented flushes, and (ii) prior to the unexpected power down event,
the first one of the segmented flushes occurred prior to the other ones of the segmented flushes,
the processing of the event log to recover the single full flush cycle of segments of the first metadata includes, based on the event log, updating each of the entries of the segment of the second metadata to recover one or more last modified entries of a corresponding one or more segments of the first metadata,
each of the one or more last modified entries of the first metadata is updated subsequent to a corresponding one of the segmented flushes and prior to the unexpected power down event,
the first entry is a predetermined number of entries prior to the second entry,
the unexpected power down event occurs during or after storing the second entry in the second memory, and
the predetermined number of entries corresponds to recovering the single full flush cycle of segments.

14. The method of claim 13, wherein:
the skipped entry comprises a logical-to-physical address association and corresponds to a first time slot;
a third entry of the event log comprises the logical-to-physical address of the skipped entry and corresponds to a second time slot; and
the second time slot is subsequent to the first time slot.

15. The method of claim 13, wherein each of the segmented flushes includes updating a first plurality of physical address associations of a plurality of logical addresses in the second lookup table with a second plurality of physical address associations of the plurality of logical addresses indicated in the first lookup table.

16. The method of claim 13, further comprising:
store third metadata in the second memory, wherein the third metadata is (i) different than the first metadata and the second metadata, and (ii) determined based on values of the first metadata or the second metadata;
as a result of the unexpected power down event, determining whether a segment of the third metadata is stored in the second memory; and
if the segment of the third metadata is stored in the second memory and while processing the event log, updating the first metadata based on a time slot corresponding to the segment of the third metadata.

17. The method of claim 16, further comprising:
if the segment of the third metadata is stored in the second memory,
incrementing an upload timer if a full flush cycle of segments since the unexpected power down event has not been uploaded, and
uploading the segment of the third metadata based on the first lookup table if a full flush cycle of segments since the unexpected power down event has been uploaded; and
incrementing the upload timer if (i) the segment of the third metadata is not stored in the second memory, and (ii) an end of the event log has not been reached.

18. The method of claim 17, further comprising, if the end of the event log has not been reached, updating (i) the third metadata, and (ii) some logical-to-physical address associations in the first lookup table based on corresponding entries in the event log.

19. The method of claim 16, wherein:
the third metadata includes information regarding the first metadata or the second metadata; and
the information regarding the first metadata or the second metadata comprises pointers of user data, pointers of system data, amounts of data stored in blocks of the first memory or the second memory, and defect information.

20. The method of claim 13, further comprising:
determining whether a proper power down has occurred, wherein a proper power down occurs when the first lookup table is flushed to the second memory prior to a last power down event;
in response to a proper power down occurring, (i) transferring the second metadata from the second memory to the first memory, and (ii) refraining from processing the event log; and in response to a proper power down having not occurred, (i) transferring the second metadata from the second memory to the first memory, and (ii) processing the event log.

21. The method of claim 13, further comprising a solid-state drive comprising the first memory and the second memory, wherein:
the first memory includes volatile memory; and
the second memory includes non-volatile memory.

\* \* \* \* \*